July 24, 1962 M. P. FORRER ET AL 3,046,497

WAVEGUIDE BALANCED MODULATOR

Filed Aug. 10, 1959 2 Sheets-Sheet 1

INVENTORS
MAX P. FORRER - AND -
BY VICTOR O. MET.

ATTORNEY.

INVENTORS
MAX P. FORRER AND
VICTOR O. MET
BY Louis P. Elbinger
ATTORNEY.

3,046,497
WAVEGUIDE BALANCED MODULATOR

Max P. Forrer and Victor O. Met, Palo Alto, Calif., assignors to General Electric Company, a corporation of New York Filed Aug. 10, 1959, Ser. No. 832,629
12 Claims. (Cl. 332—43)

This invention relates to apparatus for modulating one electrical signal with another, and more particularly to a balanced modulator for employment with microwave signals.

Amplitude modulation is the process whereby the amplitude of a signal is varied as a function of the instantaneous value of another signal. Such a process is usually accomplished by applying both input signals to suitable non-linear impedance elements. Among the output signals available from an amplitude modulator are the sideband signals, these sideband signals including signals having frequencies equal to the sum of and to the difference between the two frequencies of the two input signals. A modulator specifically adapted to produce a sideband signal is termed a frequency converter. A desirable frequency converter is one which prevents either one of the input signal frequencies from appearing with its output signal. A frequency converter usually employs a balancing technique in preventing the input signal frequencies from appearing with the output sideband signal, and is, therefore, termed a balanced modulator.

In balanced modulators of the type employed in microwave superheterodyne receivers, the input information signal, of very low intensity, is modulated with a high intensity signal provided by a local oscillator, and the difference frequency sideband is retained as the "intermediate frequency" for further amplification in the receiver. Balance modulators employed in such a fashion are also known as balanced mixers. Balanced mixers have the following significant characteristics: (1) the output I.-F. signal has a frequency very small compared with the input signal and local oscillator signal frequencies (for example, an I.-F. frequency of 30 mc. and input and local oscillator frequencies of approximately 3000 mc.), and therefore separation of the I.-F. signal from the input signals is a simple task; (2) any wide deviation in frequency of the I.-F. signal is but a very small percentage of the input signal frequency (in the above example, the total theoretical deviation is only 30 mc., which is but 1% of the input 3000 mc. signal), so that bandwidth problems of the balanced mixer are minimized; and (3) there is normally available an excess of local oscillator signal strength, so that few, if any, provisions need be made to properly match this signal to obtain proper amplitude at the non-linear elements, where modulation actually takes place (it is usually adequate if the local oscillator signal applied to the non-linear elements is greater than the applied input signal).

In certain instances, however, it is desirable to provide a microwave balanced modulator wherein the frequencies of the two input signals are substantially distant, so that the sideband difference frequency is also in the microwave spectrum. It is also desirable to provide a balanced modulator adapted to operate with frequencies covering a considerable portion of the microwave spectrum. It is further desirable to provide a balanced modulator adapted to receive two input signals having amplitudes of the same order of magnitude. Such a balanced modulator should provide, in addition to the desired difference frequency output signal, (1) means to suppress both of the input signal frequencies, each of which is in the same spectral region as the frequency of the output signal, (2) means for proper matching of both input signals, since neither has overabundant strength, and (3) means for broad bandwidth operation.

Therefore, it is the principal object of this invention to provide a novel modulator.

Another object of this invention is to provide a novel balanced modulator for employment with microwave signals.

Another object of this invention is to provide a balanced modulator for receiving a pair of microwave signals and for providing an output microwave signal.

Another object of this invention is to provide a balanced modulator adapted to receive a pair of input signals having amplitudes of the same order of magnitude.

Another object of this invention is to provide a balanced modulator adapted to function over a broad band of input signal frequencies.

The foregoing objects are achieved by providing a balanced modulator including a pair of parallel coaxial transmission line sections adapted to receive the two input signals with proper amplitudes and phase relationships, and adapted to deliver these signals to a pair of crystal diodes, wherein the diodes provide the desired output difference frequency signal but no signal having a frequency equal to that of an input signal. A first transducer is coupled to one end of both coaxial line sections for launching along the line sections a pair of oppositely phase first waves having a first frequency. A second transducer is coupled to the other end of both coaxial line sections for launching along the line sections a pair of oppositely phased second waves having a second frequency. A ridged wave guide is disposed adjacent the coaxial line sections with its axis parallel to the axes of the sections. Each one of a pair of crystal diodes is coupled between the inner conductor of a respective one of the coaxial lines and the ridge of the waveguide, the diodes being disposed symmetrically on opposite sides of the plane of symmetry of the waveguide. The diodes are disposed equidistant from the first transducer. Each transducer is appropriately matched in order that the waves it launches arrive with proper amplitude at the diodes. The ridged waveguide, which is adapted to propagate waves having a frequency equal to the difference between the above-mentioned first and second frequencies, is responsive to the sum of the currents provided by both of the diodes. Thus, a balanced modulator is provided, wherein two input microwave signals of substantially the same amplitude may be employed, wherein the amplitude of the output signal is substantially insensitive to changes in frequency of either of the input signals, and wherein the output frequency is also in the microwave spectrum.

The invention will be described with reference to the accompanying drawings, wherein.

Figures 1, 2, 4:
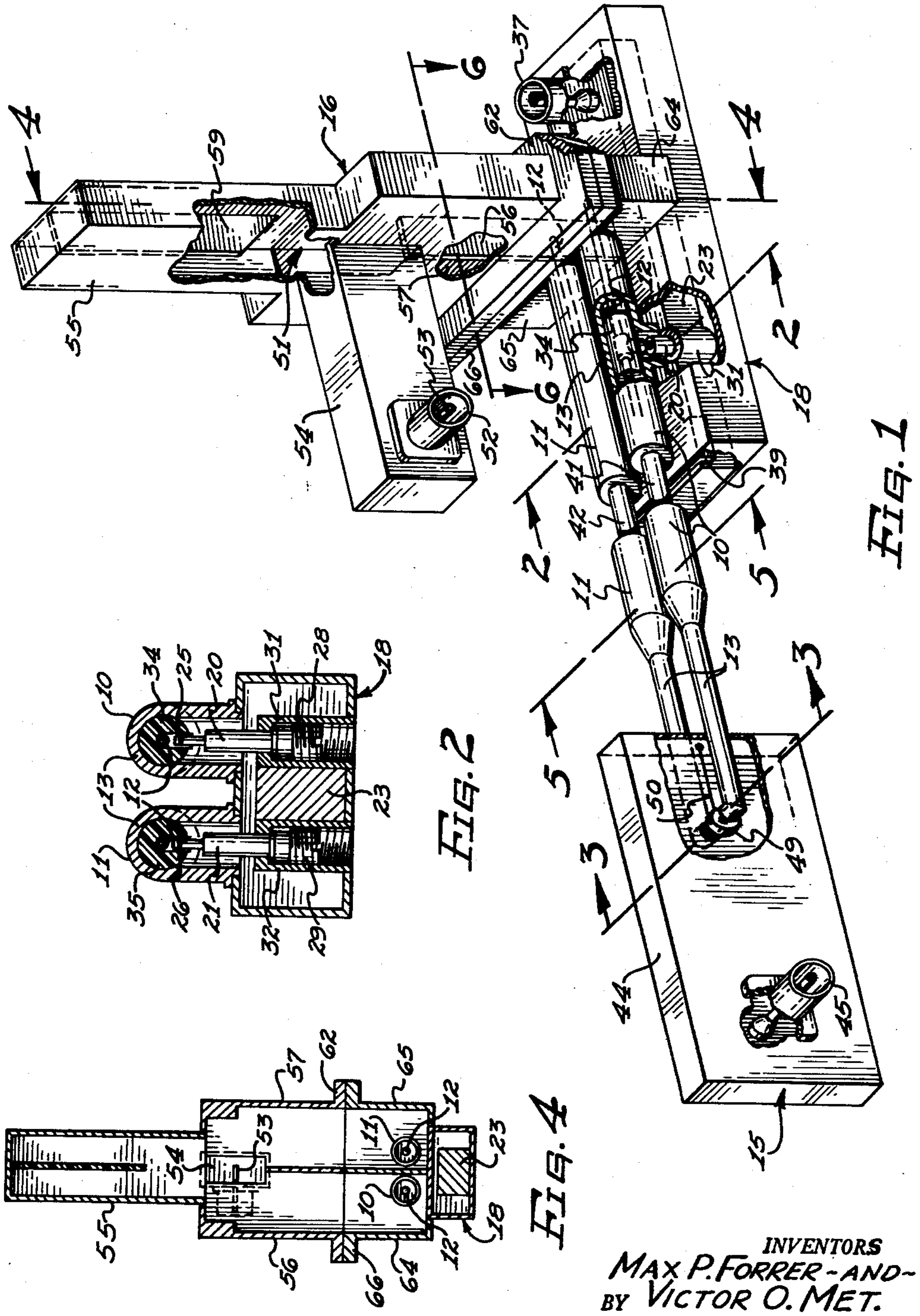
FIGURE 1 is a perspective view, partly in cross-section, of a presently preferred form of the invention.
FIGURE 2 is a sectional view taken on the line 2—2 of FIG. 1.
FIGURE 4 is a sectional view taken on the line 4—4 of FIG. 1.

In the embodiment of FIG. 1, the balanced modulator of this invention comprises a pair of coaxial transmission line sections 10 and 11. Each of coaxial line sections 10 and 11 comprises an inner conductor 12 and an outer conductor 13 and is adapted to propagate microwave energy in the TEM mode. A first transducer, shown generally as transducer 15, is adapted to receive one of the input signals, having frequency $f_1$, and in response thereto to launch a pair of oppositely phased first waves along coaxial line sections 10 and 11. Another transducer, shown generally as transducer 16, is adapted to receive the other input signal, having frequency $f_2$, and in response thereto to launch a pair of oppositely phased second waves along coaxial line sections 10 and 11 in a direction opposite to the first waves launched by transducer 15. For the particular transducers shown in FIG. 1, frequency $f_2$ must be the higher one of the two frequencies $f_1$ and $f_2$.

A ridged rectangular waveguide section 18 is disposed adjacent to coaxial lines 10 and 11. Ridged waveguides are well known in the art and are described, for example, in a publication by N. Marcuvitz, "Waveguide Handbook," section 8, McGraw-Hill Book Co., Inc., New York, 1951. Ridged rectangular waveguides are characterized by relatively low impedance and broad bandwidth properties, as compared with conventional rectangular waveguides. Waveguide section 18 is oriented with its axis substantially parallel to the axes of coaxial line sections 10 and 11.

A pair of crystal diodes 20 and 21, or other suitable nonlinear elements, are coupled between the respective inner conductors 12 of coaxial lines 10 and 11 and the ridge 23 of waveguide section 18. Crystal diodes suitable for the detection or frequency conversion of microwave signals are well known in the art, and are described, for example, in a publication by R. V. Pound, "Microwave Mixers," section 2, McGraw-Hill Book Co., Inc., New York, 1948. The detailed structure in which diodes 20 and 21 are coupled to the ridge 23 is shown more clearly in the sectional view of FIG. 2. A pair of short cylindrical conducting elements 25 and 26 are affixed at right angles to the respective inner conductors 12, of coaxial line sections 10 and 11 and bear a recessed portion for receiving a corresponding protruding portion of a respective one of crystal diodes 20 and 21. The axes of conducting elements 25 and 26 are disposed in a plane oriented at right angles to the axes of coaxial lines 10 and 11, so that the crystal diodes which are connected to conducting elements 25 and 26 are substantially equidistant from transducer 15 and also substantially equidistant from transducer 16. The protruding portions of crystal diodes 20 and 21 are inserted into the recessed portions of respective conducting elements 25 and 26 and make electrical contact therewith. The opposite ends of diodes 20 and 21 make electrical contact with ridge 23 through respective threaded conductive plugs 28 and 29. Threaded plugs 28 and 29 also function to urge crystal diodes 20 and 21 into engagement with conducting elements 25 and 26. A pair of threaded conductive sleeves 31 and 32 are held in ridge 23 on opposite sides thereof and provide a threaded receptacle for respective plugs 28 and 29. Sleeves 31 and 32 hold diodes 20 and 21 on opposite sides of ridge 23, so that diodes 20 and 21 are symmetrically spaced with respect to the plane of symmetry of ridged waveguide section 18. (The plane of symmetry of waveguide section 18 is located parallel to the length thereof and is perpendicular to the top surface of ridge 23 along the center line thereof.) Insulating bushings 34 and 35, which will propagate, without loss, microwave signals transmitted therethrough, are employed for providing mechanical support and proper spacing for the inner and outer conductors of the coaxial line sections 10 and 11 and for the corresponding conducting elements 25 and 26. These bushings may be of polystyrene, Teflon or other suitable insulating material.

The conductive path between the inner conductor 12 of coaxial line section 10, for example, and ridge 23 is through conducting element 25, crystal diode 20, plug 28, and sleeve 31. Thus, crystal diodes 20 and 21 couple the inner conductor of a respective one of the coaxial line sections to the ridge of waveguide section 18.

Diode 20 functions to intermodulate the two waves transmitted along coaxial line section 10 by tranducers 15 and 16. The modulation products generated by diode 20 are available for propagation in ridged waveguide section 18. In a similar manner, diode 21 intermodulates the two waves transmitted along coaxial line section 11 and applies the modulation products to waveguide section 18. Ridged waveguide section 18 is properly dimensioned to propagate the difference frequency sideband in the dominant ($TE_{10}$) mode; i.e., waves having a frequency of $f_2-f_1$. As will be shown later, owing to the geometry and construction of the balanced modulator, no signal having an input signal frequency $f_1$ or $f_2$ is launched in waveguide section 18.

The output signal of waveguide section 18 is delivered at an output coaxial terminal 37, which is coupled to waveguide section 18 near one end thereof. A slidable shorting element 39 is disposed between ridge 23 and the top wall of waveguide section 18 and is adjustable to obtain maximum output signal over a wide band of frequencies from the microwave modulator.

A pair of low-pass filters, such as coaxial line filters 41 and 42, are located in respective coaxial line sections 10 and 11. Coaxial line filters are well known in the are and are described, for example, in the publication by G. L. Ragan, "Microwave Transmission Circuits," section 10, McGraw-Hill Book Co., Inc., New York, 1948. Filters 41 and 42 are adapted to transmit, without loss, waves having a frequency $f_1$ that are launched by transducer 15, but to inhibit transmission of waves having a frequency $f_2$ that are launched by transducer 16. Filters 41 and 42 are effectively located one-quarter wavelength, or its equivalent, at frequency $f_2$, from the transverse plane including the axes of crystal diodes 20 and 21. In addition to preventing loss of the waves launched by transducer 16, filters 41 and 42 serve to effect a proper match to these waves for their application to crystal diodes 20 and 21.

Transducer 15 comprises a "flat" waveguide section 44 and an input coaxial terminal 45. "Flat" waveguides are well known in the art and are described, for example, in the publication, "Electronic Components Handbook," volume 2, pages 306–314, McGraw-Hill Book Co., Inc., New York, 1958. Such "flat" waveguide sections are characterized by a relatively low impedance as compared with conventional rectangular waveguides. The modulator input signal of frequency $f_1$ is applied to coaxial terminal 45 where it is transferred to waveguide section 44, and propagates to the right in the dominant ($TE_{10}$) mode. This input signal is then split by a waveguide-to-coaxial transition 46 into two waves of opposite phase traveling to the right in coaxial line sections 10 and 11. This transition 46 between waveguide section 44 and coaxial line sections 10 and 11 is shown more clearly in the sectional view of FIG. 4. Outer conductors 13 form right-angle bends and are affixed to the respective broad walls of waveguide section 44 near the center lines thereof. Inner conductors 12 also form right-angle bends and pass through respective apertures 47 in the broad walls of waveguide section 44 and are affixed to a matching antenna element 49. A thin wire 50 may be connected between element 49 and the end wall of transducer 15 to provide a D.-C. return path for diodes 20 and 21.

Figures 5, 6, 7:
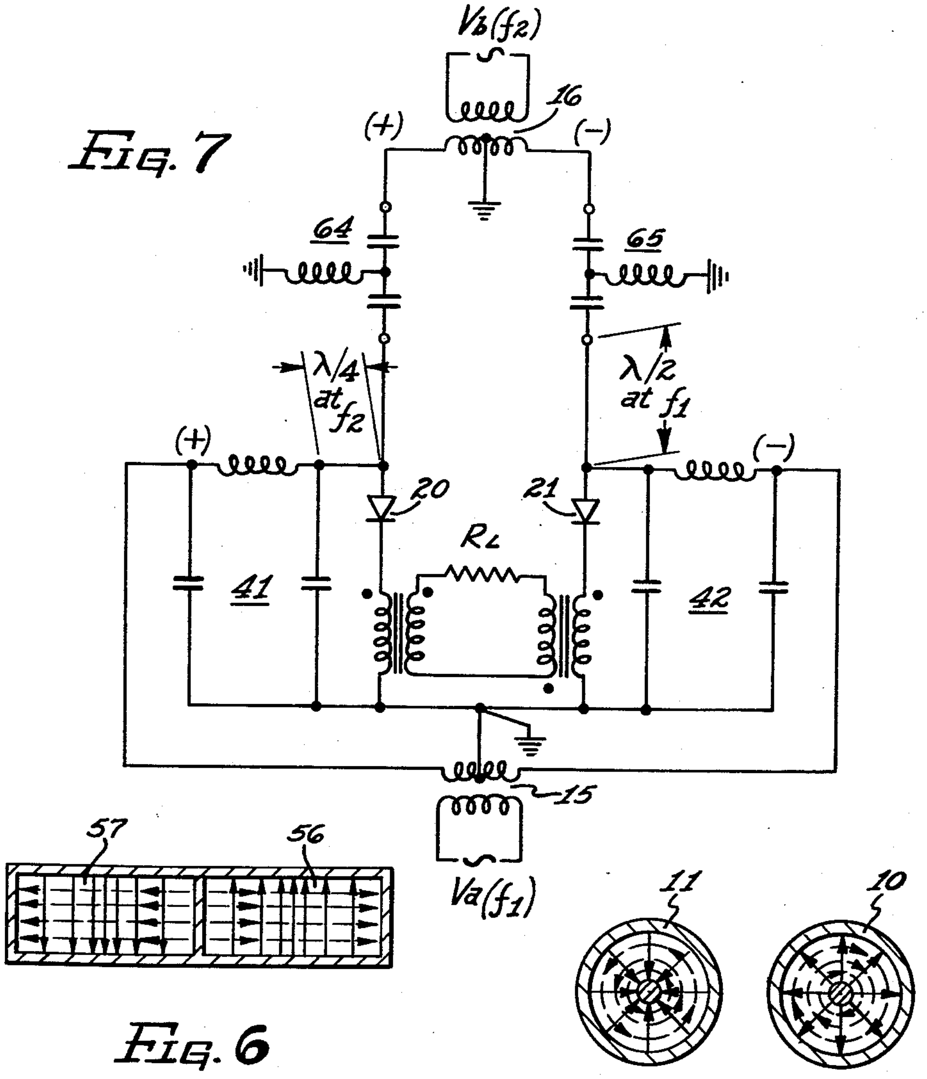
FIGURE 5 is a sectional view to illustrate the fields of the waves propagating in the coaxial line sections at the line 5—5 of FIG. 1.
FIGURE 6 is a sectional view to illustrate the fields of the waves propagating in the waveguide sections taken at the line 6—6 of FIG. 1.
FIGURE 7 is a schematic representation of the embodiment of FIG. 1.
Figure 3:
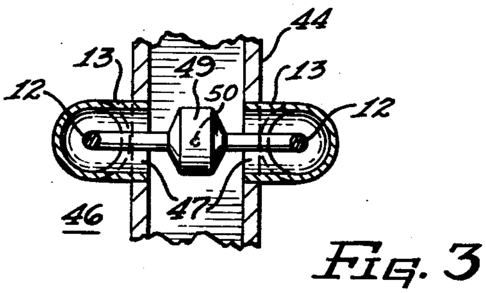
FIGURE 3 is a sectional view taken on the line 3—3 of FIG. 1.

Transsition 46 functions to launch a pair of equal amplitude waves in coaxial line sections 10 and 11, the waves having opposite phase with respect to each other. The wave propagating to the right at any point in coaxial line section 10 is 180 degrees out-of-phase with respect to the wave propagating to the right in coaxial line section 11 at a point therein equidistant from transition 46. The lengths of the coaxial line sections between transition 46 and diodes 20 and 21 are equal. Therefore, the waves launched by transducer 15 and traveling to the right in coaxial line sections 10 and 11 are of opposite phase at points equidistant from diodes 20 and 21. The fields of these waves in a section taken perpendicularly to the axes of coaxial line sections 10 and 11 are shown in FIG. 5. The solid lines denote the electric field and the broken lines, the magnetic field.

Transducer 16 comprises a folded hybrid T junction 51 and an input coaxial terminal 52 for receiving the modulator input signal of frequency $f_2$. The structure of transducer 16 and of folded hybrid junction 51 is shown more clearly in the sectional view of FIG. 4. Folded hybrid junctions are similar in operation to conventional hybrid junctions and are well known in the art. Folded hybrid junctions are available commercially, being described in, for example, the catalog "1959–1960 Electronic Engineers Master," page 818, Tech. Publishers, Inc., Hempstead, New York, 1959. The properties of hybrid junctions are described, for example, in a publication by J. F. Reintjes and G. T. Coate, "Principles of Radar," pages 825–834, Third edition, McGraw-Hill Book Co., Inc., New York, 1952.

The hybrid junction is a device provided with two pairs of conjugate arms and wherein, if the arms are suitably terminated (i.e., to avoid wave reflection), a signal applied to one arm of one conjugate pair will divide equally between the two arms of the other conjugate pair, and no portion of the applied signal will enter the other arm of said one conjugate pair. Waveguide arms 54 and 55 comprise one conjugate pair and waveguide arms 56 and 57 comprise the other conjugate pair of hybrid junction 51. In the folded hybrid junction, the arms of one conjugate pair, such as arms 56 and 57, are contiguous and parallel. A dissipative member 59 of a type such as may be found described on page 845 of the aforementioned Reintjes publication properly terminates arm 55; therefore, the input signal entering arm 54 from coaxial terminal 52 divides equally between arms 56 and 57 and no portion enters arm 55. The combination of waveguide arms 54, 56 and 57 comprises an E-junction, wherein energy entering from waveguide arm 54 launches a pair of waves of equal amplitude, but opposite phase, in waveguide arms 56 and 57. The fiields of these waves in a section taken perpendicularly to the axes of waveguide arms 56 and 57 are shown in FIG. 6. The solid lines denote the electric field and the broken lines, the magnetic field. Thus, the two waves propagating downward in waveguides 56 and 57 at any given cross-sectional plane taken perpendicularly to the axes of waveguides 56 and 57 will be 180 degrees out-of-phase with respect to each other.

Waveguides 56 and 57 terminate in a flange 62. A pair of parallel rectangular waveguide sections 64 and 65 terminate in a flange 66, which mates with flange 62. Flanges 62 and 66 may be joined by soldering, bolting, or some other suitable techniques. The oppositely phased waves launched downwardly in waveguide arms 56 and 57 will enter and propagate along the waveguide sections 64 and 65.

Coaxial line sections 10 and 11 are oriented with their axes disposed perpendicularly to the broad walls of waveguide sections 64 and 65 and are coupled to waveguide sections 64 and 65 through a respective broad wall thereof. The outer conductors 13 of coaxial line sections 10 and 11 are affixed to the respective broad walls of waveguide sections 64 and 65. The inner conductors 12 pass through respective apertures in the broad walls of waveguide sections 64 and 65 and penetrate into the waveguide sections. These coaxial-to-waveguide transitions are displaced from the center lines of the broad walls of the corresponding waveguide sections 64 and 65 to obtain proper relative position of the various components 10, 11, 15, 16 and 18. Off-center antennas in waveguides may be designed to be of extremely broad band transmission and have been described, for example, in an article by W. W. Mumford, Proc. I.R.E., volume 41, pages 256–261; February 1953. The oppositely phased waves propagating downwardly in waveguide sections 64 and 65 launch corresponding oppositely phased waves in coaxial line sections 10 and 11. The lengths of the coaxial line sections 10 and 11 between the respective waveguide sections 64 and 65 are equal. Therefore, the waves launched by transducer 16 and traveling to the left in coaxial line sections 10 and 11 are of opposite phase at points equidistant from diodes 20 and 21. These oppositely phased waves traveling toward the left in coaxial line sections 10 and 11 encounter crystal diodes 20 and 21 are intermodulated therein with the mutually oppositely phased waves launched by transducer 15 and traveling toward the right in coaxial line sections 10 and 11.

The dimensions of waveguide arms 56 and 57 and of waveguide sections 64 and 65 are designed to propagate the waves of frequency $f_2$ in the dominant, or $TE_{10}$ mode, but are designed to be beyond cutoff for signals having a frequency $f_1$. Transfer of the waves of frequency $f_1$ from coaxial lines 10 and 11 into waveguides 64 and 65 is prohibited. Therefore, wave guide sections 64 and 65 act as open circuits to waves of frequency $f_1$ traveling to the right in lines 10 and 11. The effective distance of waveguide sections 64 and 65 from the transverse plane including the axes of crystal diodes 20 and 21 is one-half wavelength, or its equivalent, at frequency $f_1$.

*Modes of Operation*

The theory of operation of this invention, as presently understood, will now be described. This description will be coupled with FIG. 7, which is a schematic diagram representative of the embodiment of FIG. 1. Transducers 15 and 16 are represented by transformers adapted to provide oppositely polarized signals at the ends of center-tapped secondary windings, to correspond to the oppositely phased signals launched in opposite directions on coaxial line sections 10 and 11 by transducers 15 and 16. Low-pass filters 41 and 42 are represented by equivalent lumped parameter $\pi$-section filters comprising a pair of capacitors connected to ground and a series inductance. The high-pass filter effects of waveguide sections 64 and 65 are illustrated as lumped parameter T-section filters having a pair of series connected capacitors and a shunt inductance connected to ground. Crystal diode 20 is shown connected through a transformer primary winding to ground from a point between filters 41 and 64. Similarly, diode 21 is shown connected through a transformer primary winding to ground from a point between filters 42 and 65. The secondary windings of the transformers connected to crystal diodes 20 and 21 are shown connected in series through a load resistor $R_L$. Load resistor $R_L$ simulates the load on waveguide section 18. These transformers represent the condition that positive currents flowing in crystal diodes 20 and 21 are summed by waveguide section 18 to supply the load thereof.

The effective distance of filters 41 and 42 from the respective crystal diodes 20 and 21 is one-quarter wavelength at frequency $f_2$. Since low-pass filters 41 and 42 are equivalent to short circuits to ground for signals of quency $f_2$, this one-quarter wavelength distance transforms the filter input impedance to a very high impedance at crystal diodes 20 and 21, thereby effecting maximum signal application at frequency $f_2$ to these diodes. The effective distance of the high-pass waveguide sections 64 and 65 from the respective diodes 20 and 21 is one-half wavelength at frequency $f_1$. Since high-pass filters 64 and 65 are effectively open circuits to signals of frequency $f_1$, this one-half wavelength distance transforms the filter input impedance to a very high impedance at diodes 20 and 21, thereby effecting maximum signal application at frequency $f_1$ to these diodes.

The input signal of frequency $f_1$ that is applied to transducer 15 may be represented by the expression $$V_a = A \sin \omega_1 t \quad (1)$$

The input signal of frequency $f_2$ applied to transducer 16 may be represented by $$V_b = B \sin(\omega_2 t + \Phi_b) \quad (2)$$

The input signal applied to transducer 15 is divided into two equal amplitude oppositely phased signals on coaxial line sections 10 and 11, which are transmitted, substantially unattenuated, through respective filters 41 and 42 to respective crystal diodes 20 and 21. Similarly, the input signal applied to transducer 16 is divided into two equal amplitude oppositely phased signals on waveguide arms 56 and 57, which are transmitted, substantially unattenuated, through respective coaxial line sections 10 and 11 to respective diodes 20 and 21. The superposition of the voltages of frequencies $f_1$ and $f_2$, at crystal diodes 20 and 21, is given respectively by the following equations:

$$V_{c1} = k_a A \sin(\omega_1 t + \Phi_1) + k_b B \sin(\omega_2 t + \Phi_2) \quad (3)$$

$$V_{c2} = k_a A \sin(\omega_1 t + \Phi_1 + \pi) + k_b B \sin(\omega_2 t + \Phi_2 + \pi) \quad (4)$$

In Equations 3 and 4 the constants $k_a$ and $k_b$ represent the attenuation of the input signals due to their being split into two oppositely phased signals, and any other attenuation which may occur in transmitting these signals to the crystal diodes.

The non-linear characteristic of crystal diodes 20 and 21, or other non-linear elements, may be approximated by the following equations:

$$i_1 = a_0 + a_1 V_{c1} + a_2 V_{c1}^2 \quad (5)$$

$$i_2 = a_0 + a_1 V_{c2} + a_2 V_{c2}^2 \quad (6)$$

where $i_1$ represent sthe current flowing in diode 20 when the voltage $V_{c1}$ is applied thereto and $i_2$ represents the current flowing in diode 21 when the voltage $V_{c2}$ is applied thereto.

Owing to the geometrical symmetry of the embodiment of FIG. 1, the currents flowing in diodes 20 and 21 are effectively added in launching waves in ridged waveguide section 18. Thus, the signal launched in wave guide section 18 may be represented by the following equation:

$$V_0 = k_0(i_1 + i_2) \quad (7)$$

where $k_0$ represents the conversion constant in transforming from current to voltage terminology.

Substituting Equations 3, 4, 5 and 6 into Equation 7, there results $$V_0 = k_0 + k_1 \sin[(\omega_2 - \omega_1)t + \phi_d] + k_2 \sin[(\omega_2 + \omega_1 t + \phi_s] + k_3 \sin(2\omega_1 t + \phi_3) + k_4 \sin(2\omega_2 t + \phi_4) \quad (8)$$

Equation 8 illustrates that no signals have the frequencies of the input signals are launched in waveguide section 18. The only significant signals which are launched therein are signals having frequencies equal to the sum of and the difference between the applied signal frequencies and the second harmonic products of the input signal frequencies. The sum frequency component and the second harmonic frequency components are easily separated by filtering from the desired difference frequency component, and thus, the balanced modulator function is achieved.

The polarity of either of the input signals may be inverted, so that, for example, the term in Equation 3 due to the input signal $V_a$ may appear in Equation 4, and vice versa. This inversion does not affect the operation of this invention. It is sufficient to employ the embodiment of FIG. 1, wherein each of the two input signals is split into two components having substantially equal amplitudes and opposite phases, and each component of one of the input signals is inter-modulated with a respective component from the other input signal by the crystal diodes.

In the embodiment of FIG. 1, the frequency of the input signal $V_b$ was held at 6.0 kmc., while the frequency of the input signal $V_a$ was varied from 2.8 to 3.2 kmc. Satisfactory balanced modulator operation resulted over the entire variation of frequency of $V_a$. The frequency of the output signal delivered by waveguide section 18 varied over a corresponding band as $V_a$ was varied; for example, when $V_a$ was 2.8 kmc., the frequency of $V_0$ was 3.2 kmc., and when the frequency of $V_a$ was 3.2 kmc., that of $V_0$ was 2.8 kmc.

Thus, there has been described a balanced modulator for employment at microwave frequencies adapted to receive a pair of microwave signals and to provide an output signal having a frequency equal to the difference between the two input signal frequencies, this output frequency also being in the microwave spectrum. Owing to the geometry of the structure, wherein the non-linear elements lie in a common transverse plane with respect to the coaxial line sections propagating the two input signals, there are no critical dimensions involved, and broad band operation is realized. No limitations are placed on the relative magnitudes of the two input signals inasmuch as both are properly matched to the non-linear elements employed.

While the principles of the invention have now been made clear in illstrative embodiments, there will be immediately obvious to those skilled in the art many modifications in structure, arrangement, proportions, the elements, materials, and components, used in the practice of the invention, and otherwise, which are particularly adapted for specific environments and operating requirements, without departing from those principles. The appended claims are therefore intended to cover and embrace any such modifications, within the limits only of the true spirit and scope of the invention.

What is claimed is:

1. In combination, first and second wave transmission means, a first non-linear impedance element coupled to said first wave transmission means and responsive to waves therein, a second non-linear impedance element coupled to said second wave transmission means and responsive to waves therein, a first transducer for launching in said first and second wave transmission means a pair of oppositely phased first waves having a first frequency, wherein said first waves have opposite phases at cross-sections of said first and second transmission means equidistant from the corresponding non-linear elements, a second transducer for launching in said first and second wave transmission means a pair of oppositely phased second waves having a second frequency, wherein said second waves have opposite phases at cross-sections of said first and second transmission means equidistant from the corresponding nonlinear elements, and an output wave transmission means coupled to both of said non-linear elements and responsive to the signals provided thereby.

2. A combination, as in claim 1, wherein said output wave transmission means is responsive to the sum of the currents flowing in both of said non-linear elements.

3. A combination, as in claim 1, wherein said output wave transmission means is adapted to transmit a wave having a frequency equal to the difference between said first and second frequencies.

4. A combination, as in claim 2, further including first filter means disposed between said first transducer and said first and second transmission means and adapted to transmit waves having said first frequency and to prohibit transmision of waves having said second frequency, and a second filter means disposed between said second transducer and said first and second transmission mean and adapted to transmit waves having said second frequency and to prohibit transmission of waves having said first frequency.

5. A combination, as in claim 1, wherein each of said non-linear elements comprises a diode, and wherein the pair of said diodes are similarly poled with respect to the corresponding one of said first and second wave transmission means.

6. A combination, as in claim 1, wherein said first and second wave transmission means are substantially parallel.

7. A combination, as in claim 6, wherein said first and second wave transmission means are coaxial transmission line sections.

8. A combination, as in claim 7, wherein said output wave transmission means is a ridged waveguide, said waveguide being adapted to transmit a wave having a frequency equal to the difference between said first and second frequencies.

9. A combination, as in claim 8, wherein said waveguide is disposed substantially parallel to said coaxial line sections and wherein said non-linear impedance elements are crystal diodes, said diodes being coupled between the inner conductor of the corresponding coaxial line section and the ridge of said waveguide.

10. A combination, as in claim 9, wherein said diodes are similarly poled with respect to the corresponding ones of said inner conductors and are symmetrically disposed with respect to the plane of symmetry of said waveguide.

11. A balanced modulator comprising a pair of substantially parallel wave transmission means, a first transducer for launching in said transmission means a pair of oppositely phased first waves having a first frequency, wherein said first waves have opposite phases at cross-sections of said transmission means equidistant from said first transducer, a second transducer for launching in said transmission means a pair of oppositely phased second waves having a second frequency, wherein said second waves have opposite phases at cross-sections of said transmission means equidistant from said second transducer, a pair of non-linear impedance elements disposed substantially equidistant from said first transducer, each of said non-linear elements being coupled to a respective one of said transmission means, said non-linear elements being responsive to waves in the corresponding transmission means for generating the modulation products thereof, and an additional wave transmission means coupled to both of said non-linear impedance elements and responsive to the modulation products thereof for propagating a wave having a frequency equal to the difference between said first and second frequencies.

12. A microwave balanced modulator comprising a pair of substantially parallel coaxial transmission line sections, a ridged waveguide disposed substantially parallel to said coaxial line sections, a pair of crystal diodes, each of said diodes being coupled between the inner conductor of a corresponding one of said coaxial line sections and the ridge of said waveguide and being disposed on opposite sides of the plane of symmetry of said waveguide, the axes of said diodes being disposed in a plane oriented perpendicularly to the axes of said coaxial line sections, a first transducer coupled to said coaxial line sections at one end thereof and adapted to launch in said line sections a pair of oppositely phased first waves having a first frequency, wherein said first waves have opposite phases at cross-sections of said coaxial line sections equidistant from the corresponding one of said diodes, a second transducer coupled to said coaxial line sections at the other end thereof and adapted to launch in said line sections a pair of oppositely phased second waves having a second frequency, wherein said second waves have opposite phases at cross-sections of said coaxial line sections equidistant from the corresponding one of said diodes, wherein said first transducer is adapted to prohibit transmission of waves having said second frequency and said second transducer is adapted to prohibit transmission of waves having said first frequency, and wherein said ridged waveguide is adapted to transmit a wave having a frequency equal to the difference between said first and second frequencies.

References Cited in the file of this patent

UNITED STATES PATENTS

| | | |
|---|---|---|
| 2,116,559 | Caruthers | May 10, 1938 |
| 2,547,378 | Dicke | Apr. 3, 1951 |
| 2,552,052 | Matare | May 8, 1951 |
| 2,705,304 | Fiet | Mar. 29, 1955 |
| 2,783,378 | Vogeley | Feb. 26, 1957 |